United States Patent
Kim et al.

(10) Patent No.: US 8,116,111 B2
(45) Date of Patent: Feb. 14, 2012

(54) NONVOLATILE MEMORY DEVICES HAVING ELECTROMAGNETICALLY SHIELDING SOURCE PLATES

(75) Inventors: Jong-Won Kim, Gyeonggi-do (KR); Woon-Kyung Lee, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 467 days.

(21) Appl. No.: 12/437,209

(22) Filed: May 7, 2009

(65) Prior Publication Data

US 2009/0296477 A1 Dec. 3, 2009

(30) Foreign Application Priority Data

Jun. 3, 2008 (KR) .......................... 10-2008-0052251

(51) Int. Cl.
*G11C 5/06* (2006.01)
(52) U.S. Cl. ..................................... 365/63; 365/185.05
(58) Field of Classification Search .................... 365/63, 365/185.05
See application file for complete search history.

(56) References Cited

U.S. PATENT DOCUMENTS

| | | | |
|---|---|---|---|
| 6,255,164 B1 | 7/2001 | Liu et al. | |
| 6,686,624 B2 * | 2/2004 | Hsu | 257/315 |
| 6,797,570 B2 | 9/2004 | Shin et al. | |
| 7,359,226 B2 * | 4/2008 | Schwerin | 365/49.1 |
| 7,433,242 B2 * | 10/2008 | Ohsawa | 365/185.27 |

FOREIGN PATENT DOCUMENTS

| | | |
|---|---|---|
| KR | 1020020062435 A | 7/2002 |
| KR | 1020050120860 A | 12/2005 |

\* cited by examiner

*Primary Examiner* — Son Dinh
(74) *Attorney, Agent, or Firm* — Myers Bigel Sibley & Sajovec, P.A.

(57) ABSTRACT

Provided are a semiconductor device and a method of fabricating the same. The semiconductor device includes a semiconductor substrate including a cell array region, memory cell transistors disposed at the cell array region, bitlines disposed on the memory cell transistors, and a source plate disposed between the memory cell transistors and the bitlines to veil the memory cell transistors thereunder.

20 Claims, 16 Drawing Sheets

NONVOLATILE MEMORY DEVICES HAVING ELECTROMAGNETICALLY SHIELDING SOURCE PLATES

CROSS-REFERENCE TO PRIORITY APPLICATION

This application claims priority to Korean Patent Application No. 2008-52251, filed on Jun. 3, 2008, the contents of which are hereby incorporated herein by reference.

FIELD OF THE INVENTION

The present invention relates to integrated circuit devices and methods of forming same and, more particularly, to integrated circuit memory devices and methods of forming same.

BACKGROUND

Cell strings of a NAND flash memory device include a common source line connecting source regions to one another, bitline lines connected to drain regions, respectively, and memory cell transistors connecting the source regions to the drain regions in series.

A method of fabricating the NAND flash memory device includes forming the memory cell transistor on a semiconductor substrate and forming an interlayer dielectric to cover the resultant structure. A trench is formed by patterning the interlayer dielectric to expose a semiconductor substrate of the source regions. The trench is filled by forming the common source line to connect the source regions to one another. Bitline plugs are formed to penetrate the interlayer dielectric. Bitlines are formed to be each connected to the drain region.

SUMMARY

Non-volatile memory devices according to embodiments of the invention include a memory array containing a plurality of strings (e.g., NAND-type strings) of non-volatile memory cells located at side-by-side locations in a substrate. The plurality of strings of non-volatile memory cells include a row of string select transistors, a plurality of rows of non-volatile memory cells and a row of ground select transistors. The non-volatile memory cells may be charge-trap type cells or floating gate cells, for example. A plurality of bit lines are provided, which are electrically coupled to respective ones of the plurality of strings of non-volatile memory cells. In addition, to provide electrical isolation between the bit lines and the memory cells, a source plate is provided between the bit lines and the plurality of word lines associated with the strings of non-volatile memory cells. The source plate, which is electrically coupled to source regions within the row of ground select transistors, extends in two-dimensions over a plurality of word lines associated with each of the plurality of strings of non-volatile memory cells. In particular, the source plate may extend as an uninterrupted metal layer across a plurality of rows of the plurality of strings of non-volatile memory cells. The source plate may also be electrically coupled by a source line plug to a source line that is coplanar with said plurality of bit lines.

According to further embodiments of the invention, each of the drain regions of the string select transistors are electrically coupled by a bit line plug to a corresponding bit line. In addition, a diffusion barrier layer may be provided that surrounds each of a plurality of the bit line plugs, with the diffusion barrier layer being coplanar with the source plate. In some embodiments of the invention, the diffusion barrier layer may be formed of an electrically insulating material selected from a group consisting of silicon nitride and silicon oxynitride.

According to additional embodiments of the invention, an integrated circuit memory device is provided having a non-volatile memory array therein. This non-volatile memory array includes a plurality of NAND-type strings of non-volatile memory cells, with each string including a ground select transistor, a plurality of non-volatile memory cells and a string select transistor. A source plate is provided, which extends over the plurality of NAND-type strings of non-volatile memory cells. The source plate is electrically coupled to source terminals of each of the ground select transistors. A plurality of bit lines extend over the source plate. The plurality of bit lines are electrically coupled to drain terminals of each of the string select transistors. These memory devices further include a first interlayer insulating layer of a first material extending between the source plate and the plurality of NAND-type strings of non-volatile memory cells. An electrically insulating diffusion barrier layer of a second material may also be provided on the first interlayer insulating layer. This diffusion barrier layer is formed so that a plurality of bit line plugs, which are electrically coupled to the plurality of bit lines, extend through the electrically insulating diffusion barrier layer. The diffusion barrier layer may be formed so that its upper surface is coplanar with an upper surface of the source plate. A source line may also be provided, which is coplanar with the plurality of bit lines. An electrically conductive source line plug is provided that electrically connects the source plate to the source line. This source plate is configured as a continuous metal layer that operates to electromagnetically shield the non-volatile memory cells from fluctuations in voltages on the plurality of bit lines during memory programming operations.

Still further embodiments of the invention may include methods of forming non-volatile memory devices. These methods may include forming a first interlayer insulating layer on a memory array having a plurality of strings of non-volatile memory cells therein at side-by-side locations in a semiconductor substrate. This plurality of strings of non-volatile memory cells may include a row of ground select transistors, a plurality of rows of non-volatile memory cells and a row of string select transistors. The first interlayer insulating layer is then patterned to define: (i) at least one source region contact opening therein that exposes at least one source region of a ground select transistor, and (ii) a plurality of drain region contact openings therein that expose respective drain regions of corresponding string select transistors. An electrically conductive layer is then deposited that extends onto the first interlayer insulating layer and into the at least one source region contact opening and the plurality of drain region contact openings. The deposited electrically conductive layer is then patterned into a source plate, which covers the plurality of strings of non-volatile memory cells, and a plurality of bit line contact plugs. A second interlayer insulating layer is then formed on the source plate and the plurality of bit line contact plugs. This second interlayer insulating layer is patterned to define a plurality of bit line contact openings therein that expose corresponding ones of the plurality of bit line contact plugs. A plurality of bit lines are then formed that extend on the second interlayer insulating layer and into the plurality of bit line contact openings.

According to further embodiments of the present invention, the patterning of the second interlayer insulating layer includes patterning the second interlayer insulating layer to define a source plate contact opening therein. The step of forming a plurality of bit lines may also include forming a source line that extends on the second interlayer insulating layer and into the source plate contact opening. The source plate may be formed to have a width greater than a spacing between a pair of adjacent strings in the plurality of strings of non-volatile memory cells and a length greater than a distance between a word line associated with an uppermost non-volatile memory cell in a first one of the plurality of strings of non-volatile memory cells and a word line associated with a lowermost non-volatile memory cell in the first one of the plurality of strings of non-volatile memory cells.

BRIEF DESCRIPTION OF THE DRAWINGS

FIGS. 2A through 5A are cross-sectional views taken along a dotted line I-I' of FIG. 1, which illustrate a method of fabricating a NAND flash memory device according to an embodiment of the present invention.

FIGS. 2B through 5B are cross-sectional views taken along a dotted line II-II' of FIG. 1, which illustrate a method of fabricating a NAND flash memory device according to an embodiment of the present invention.

DETAILED DESCRIPTION OF THE EMBODIMENTS

Figure 1:
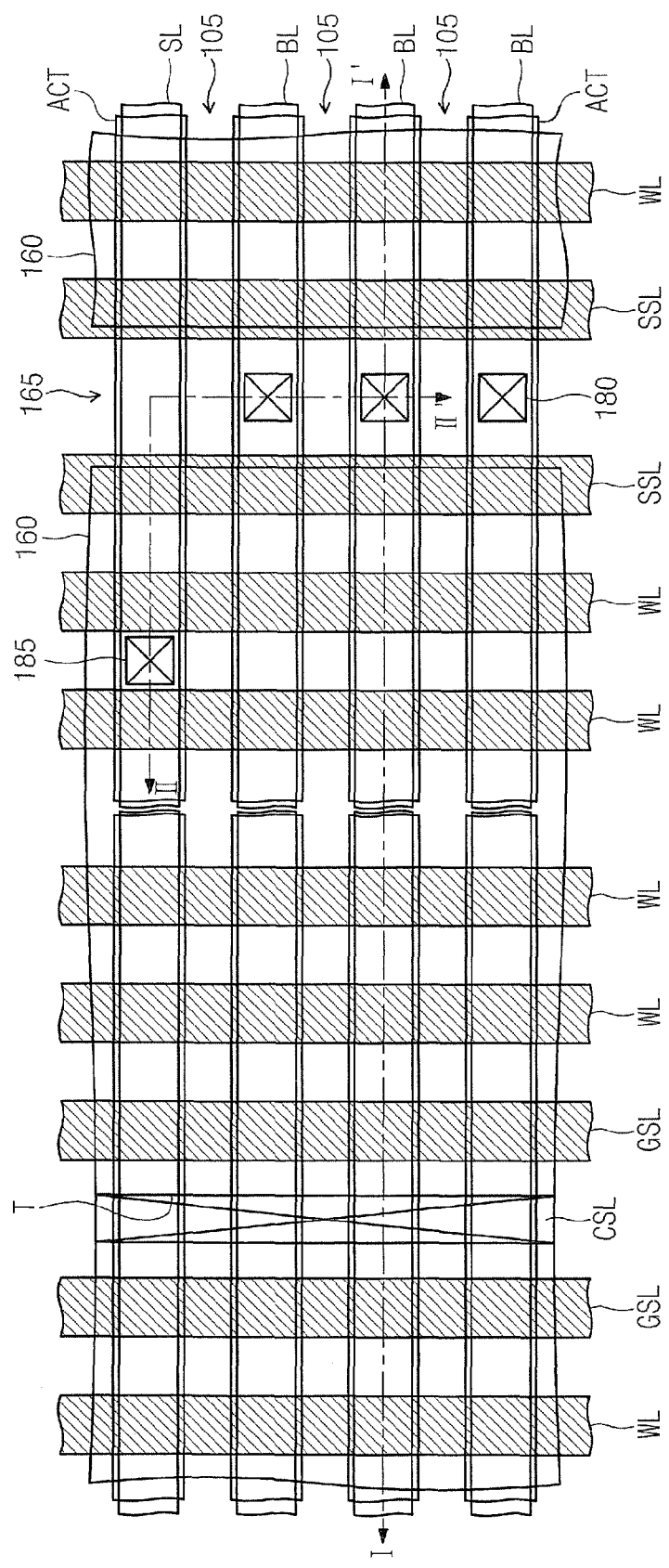
FIG. 1 is a top plan view showing a portion of a cell array region of a NAND flash memory device according to an embodiment of the present invention.

The present invention will now be described more fully hereinafter with reference to the accompanying drawings, in which preferred embodiments of the invention are shown. This invention, however, may be embodied in many different forms and should not be construed as limited to the embodiments set forth herein. Rather, these embodiments are provided so that this disclosure will be thorough and complete, and will fully convey the scope of the invention to those skilled in the art. In the drawings, the thicknesses of layers and regions are exaggerated for clarity. It will also be understood that when a layer is referred to as being "on" another layer or substrate, it can be directly on the other layer or substrate, or intervening layers may also be present. In addition, the expression "a layer A has an etch selectivity with respect to another layer B" means that one of the layers A and B can be selectively etched while minimizing etching of the other.

FIG. 1 is a top plan view showing a portion of a cell array region of a NAND flash memory device according to an embodiment of the present invention. FIGS. 2A through 5A and FIG. 2B through 5B are cross-sectional views illustrating a method of fabricating a NAND flash memory device according to an embodiment of the present invention. Specifically, FIGS. 2A through 5A are cross-sectional views taken along a dotted line I-I' of FIG. 1, and FIG. 2B through 5B are cross-sectional views taken along a dotted line II-II' of FIG. 1.

Figure 2A:
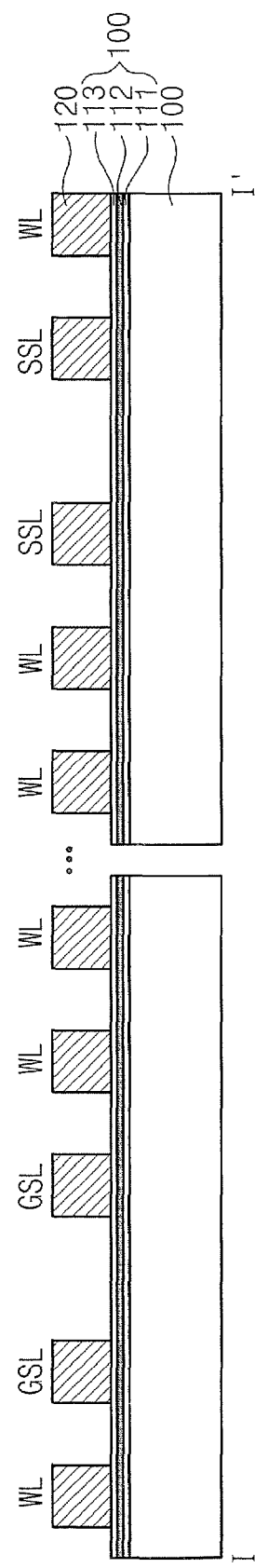
Figure 2B:
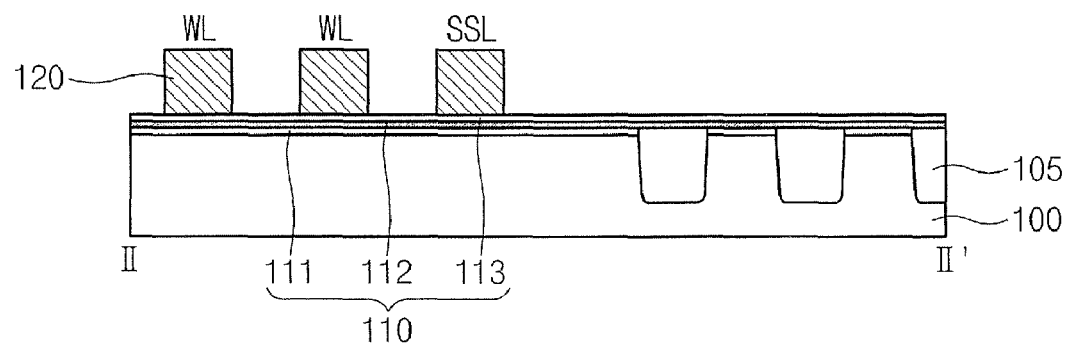

Referring to FIGS. 1, 2A, and 2B, isolation patterns 105 are formed on a semiconductor substrate 100 to define active region ACT. A gate insulator 110 and gate electrodes 120 are sequentially formed on the active regions ACT.

In this embodiment, the gate insulator 110 may include a tunnel insulating layer 111, a charge storage layer 112, and a blocking insulating layer 113 which are stacked in the order named. Although the charge storage layer 112 may be a material having charge trap sites (e.g., silicon nitride or silicon oxynitride), the material is not limited thereto and may employ various materials. For example, the charge storage layer 112 may be an insulative material including silicon dots. The blocking insulating layer 113 may include at least one of materials having a higher dielectric constant or work function than the tunnel insulating layer 111. The tunnel insulating layer 111 may be silicon oxide formed by means of a thermal oxidation process, but may also employ various materials.

The gate electrodes 120 are disposed in a direction crossing the active regions ACT. In this embodiment, the gate electrodes 120 may include ground selection lines GSL disposed adjacent to one another to define source regions, string selection lines SSL disposed adjacent to one another to define drain regions, and wordlines WL disposed between the ground/string selection lines GSL/SSL. The ground/string selection lines GSL/SSL define cell regions where memory cell transistors are formed, and the wordlines WL are disposed on the cell regions to be used as a gate electrode of the memory cell transistors. As illustrated, a distance between two adjacent wordlines WL may be shorter than that between adjacent two ground selection GSL or two adjacent string selection lines SSL.

Figure 3A:
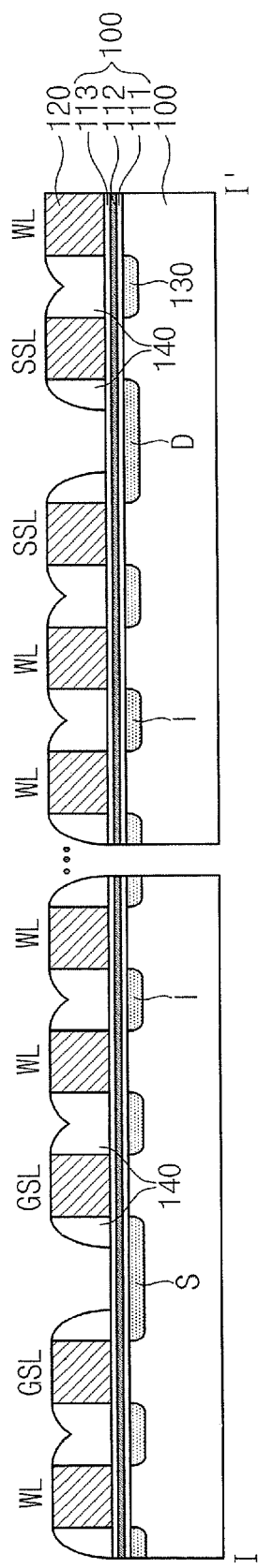
Figure 3B:
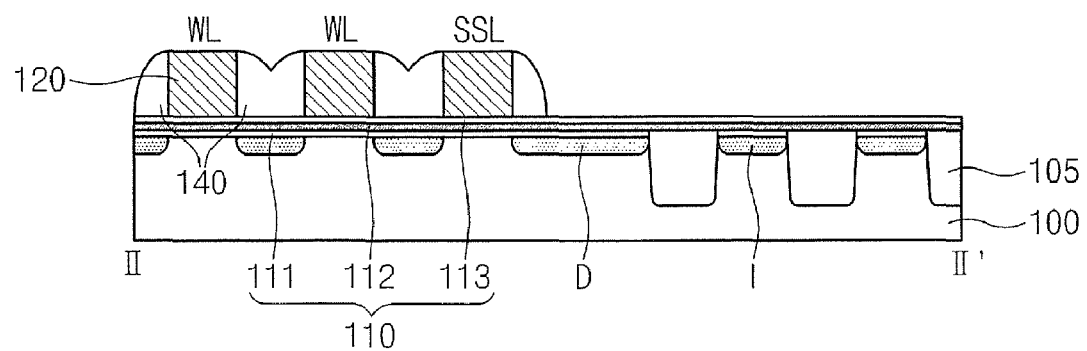

Referring to FIGS. 1, 3A, and 3B, impurity regions are formed between the gate electrodes 120. Gate spacers 140 are formed on sidewalls of the gate electrodes 120.

The impurity regions 130 between the wordlines WL are used as a source/drain electrode 1 of a memory cell transistor to connect two adjacent memory cell transistors in series. The impurity regions 130 formed between the two adjacent ground selection lines GSL (i.e., at the source region) are used as source electrodes S of cell strings. The impurity regions 130 formed between the two adjacent string selection lines SSL (i.e., at the drain region) are used as drain electrodes D of cell strings. The impurity regions 130 may be formed by means of an ion implanting process using the gate electrodes 120 as ion masks.

In case of a NAND flash memory device according to a modified embodiment of the present invention, the memory cell transistors may be connected using field effect junction areas. That is, in case a distance between the gate electrodes 120 is short, the semiconductor substrate 100 between the gate electrodes 120 is inverted by a parasitic field from the gate electrodes 120 to act as a junction area. The field effect junction area means a junction area formed by this manner. According to the modified embodiment, forming the impurity regions 130 may be omitted or a conductivity type or concentration of implanted impurities may be changed The gate spacers 140 are formed of an insulative material. Based on the feature of the present invention concerned with a distance between the gate electrodes 120, the gate spacers 140 may fill a space between the wordlines WL while being formed between the ground and string selection lines GSL and SSL to expose the semiconductor substrate 100 or the impurity region 130. In one embodiment, an ion implanting process may be further performed using the gate electrodes 120 and the gate spacers 140 as masks. In this case, a heavily doped region (not shown) having a different conductivity type than the semiconductor substrate 100 may be formed at an exposed semiconductor substrate 100 between the gate spacers 140.

Figure 4A:
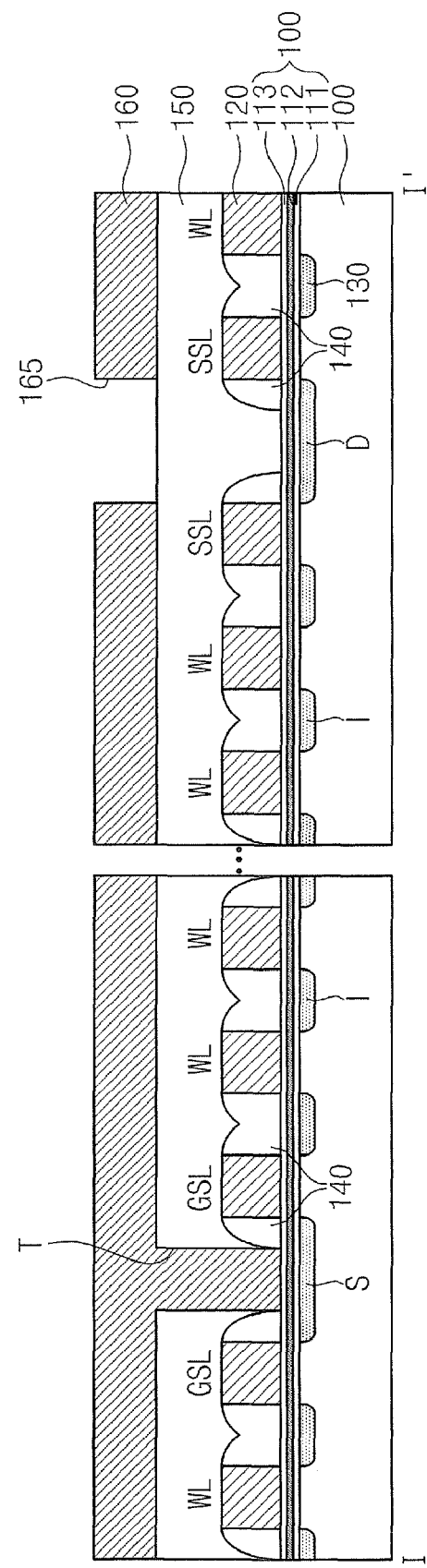
Figure 4B:
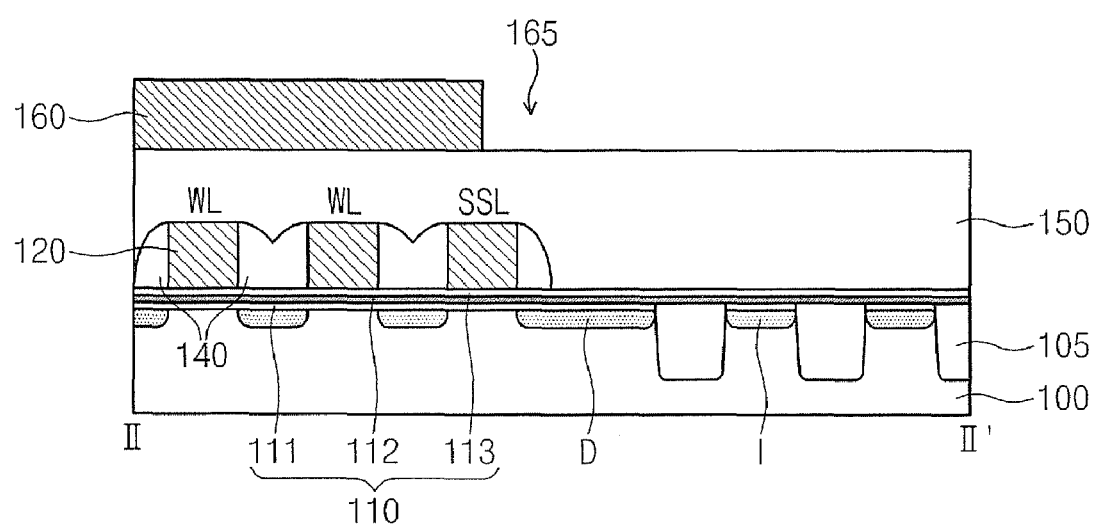

Referring to FIGS. 1, 4A, and 4B, a first interlayer dielectric 150 is formed on the resultant structure where the gate spacers 140 are formed. The first interlayer dielectric 150 may be one of silicon oxide layers and further include a silicon nitride layer or a silicon oxynitride layer used as an etch-stop layer. As set forth in the description of related art, forming the first interlayer dielectric 150 may further performing a polishing process (e.g., chemical mechanical polishing (CMP) process) to planarize a top surface of the first interlayer dielectric 150.

A trench T is formed by patterning the first interlayer dielectric 150 to expose source electrodes S of the cell strings. After a source conductive layer is formed to fill the trench T, it is patterned to form a source plate 160. The trench T may be formed to cross the isolation patterns 105 and expose top surfaces of the active regions ACT. In this case, the trench T may be formed to exhibit a linear shape. The source conductive layer may include a barrier metal layer and a metal layer that may be formed of at least one selected from the group consisting of tungsten, aluminum, and copper. Since the source conductive layer formed to fill the trench T connects a plurality of source regions S of cell strings, it may be used as a common source line CSL of a NAND flash memory device. As will be described with reference to FIG. 9, the source plate 160 may be formed by means of a different process than the common source line CSL.

The source plate 160 may be formed to have an opening 165 to expose a top surface of the first interlayer dielectric 150 on the drain electrodes of the cell strings. The opening 165 of the source plate 160 may be formed over the drain region D. In one embodiment, as shown in FIG. 1, the opening 165 may be linearly formed to cross the isolation patterns 105. In an alternative embodiment, the source plate 160 formed to over the entire surface of the cell array region except the drain electrodes of the cell strings. In this case, it is possible to suppress characteristic variation of a memory cell transistor which may result from mobile charges and damage in a subsequent process. Meanwhile, in a conventional NAND flash memory device, the common source line CSL is locally formed between the ground selection lines GSL. Therefore, memory cell transistors are not protected from mobile charges and damage during a subsequent process.

Moreover, according to a conventional art, forming the first interlayer dielectric 150 includes performing a polishing process to planarize a top surface of the first interlayer dielectric 150, as set forth above. Therefore, electrical short may occur. More specifically, the CMP process may cause scratches on the top surface of the first interlayer dielectric 150 and the scratches may be filled with a conductive layer for forming a subsequent common source line CSL. In case such a conductive material remains without being removed from the scratches, electrical short may occur between bitline plugs and bitlines which are formed in a subsequent process.

According to embodiments of the present invention, forming the source plate 160 includes patterning the source conductive layer by means of photolithography and etching process. Etching the source conductive layer may include overetching the source conductive layer using an etch recipe having an etch selectivity with respect to the first interlayer dielectric 150. In this case, although the first interlayer dielectric 150 are scratched during a polishing process, a source conductive layer in the scratch may be fully removed by the overetching. As a result, it is possible to prevent or decrease conductive bridge and electrical short which occur in a conventional art.

Figure 5A:
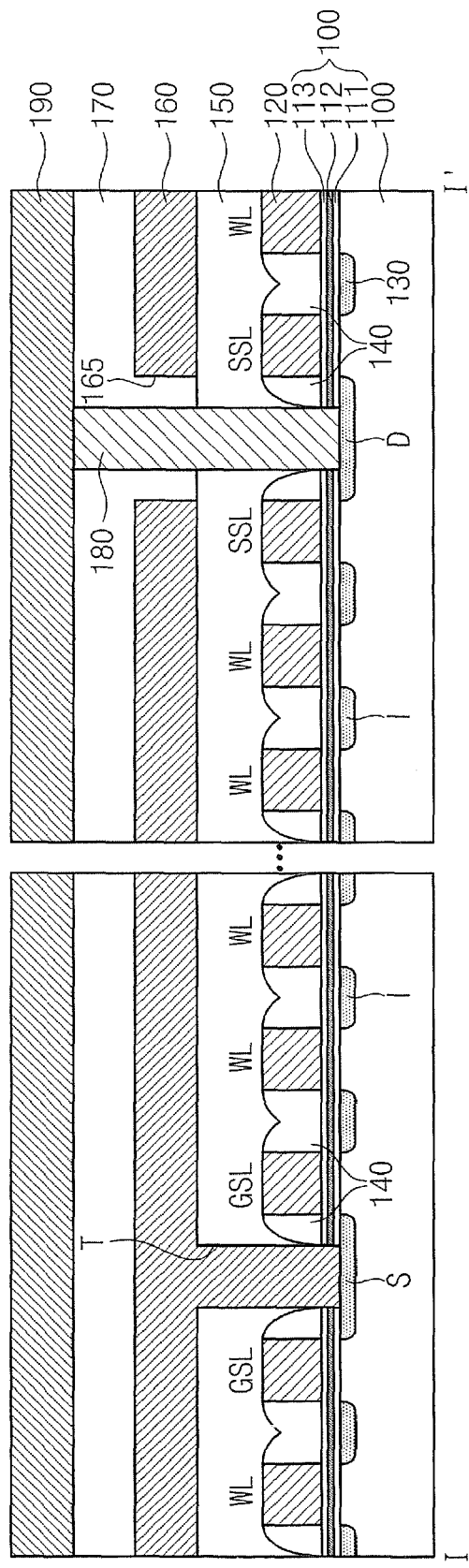
Figure 5B:
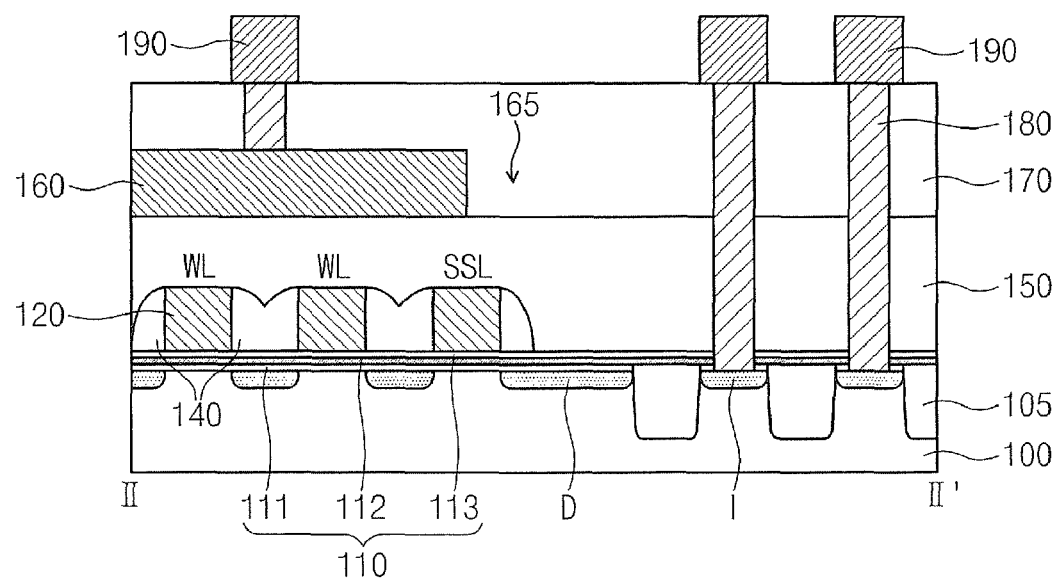

Referring to FIGS. 1, 5A, and 5B, a second interlayer dielectric 170 is formed on the resultant structure where the source plate is formed. A bitline plug 180 is formed to be connected to the drain regions D through the second and first interlayer dielectrics 170 and 150. Bitlines 190 are formed on the second interlayer dielectric 170 to be bitline plugs 180, respectively.

The bitline plugs 180 are spaced apart from sidewalls of the opening 165 to be electrically isolated from the source plate 160. For example, as illustrated, the sidewalls of the opening 165 may be formed on the string selection line SSL. In this case, a distance between the source plate 160 and the bitline plugs 180 may be reduced to prevent mobile charges and damage from affecting memory cell transistors in a subsequent process. However, the minimum of the distance therebetween is required to be selected within the range capable of maintaining an insulating property even on the maximum voltage applied between source and drain regions during operation of a product.

According to this embodiment, the second interlayer dielectric 170 is formed to cover the source plate 160 while filling the opening 165. The second interlayer dielectric 170 may include silicon oxide. The bitlines 190 are formed on the active regions ACT in a direction crossing the gate electrodes 120.

Figure 6:
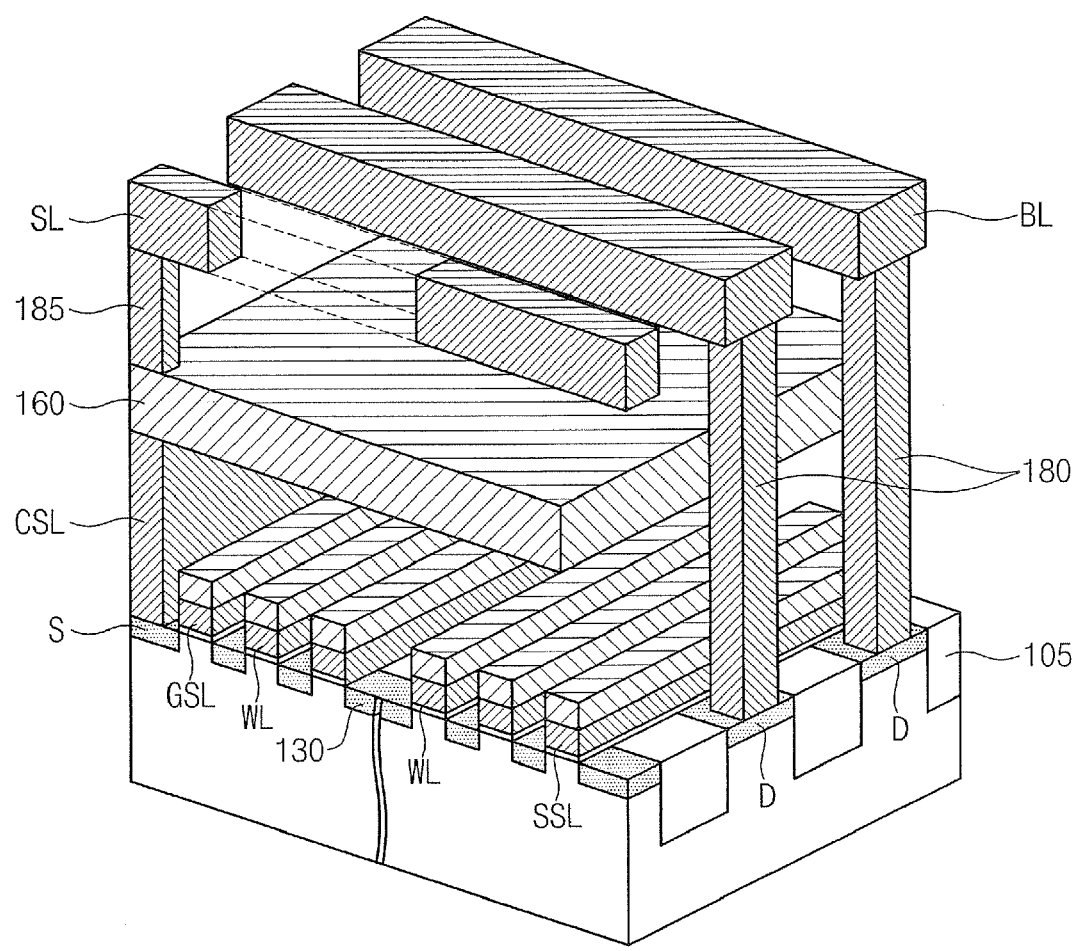
FIG. 6 is a perspective view showing a portion of a cell array region of a NAND flash memory device according to an embodiment of the present invention.

FIG. 6 is a perspective view showing a portion of a cell array region of a NAND flash memory device according to an embodiment of the present invention.

Referring to FIGS. 1 and 6, a semiconductor substrate 100 includes active regions ACT defined by isolation patterns 105. Gate electrodes 120 are disposed on the isolation patterns 105 to cross over the active regions ACT, and impurity regions 130 are formed at a semiconductor substrate 100 between the gate electrodes 120. As described with reference to FIG. 2, the gate electrodes 120 may be used as a ground selection line GSL, a string selection line SSL, and wordlines WL.

Each of the impurity regions 130 formed at one side of the ground selection line GSL may be used as a source electrode S of a cell string, and the source electrodes S are electrically connected by a common source line CSL to be equipotential. Each of the impurity regions 130 formed at one side of the string selection line SSL may be used as a drain electrode D of a cell string, and the drain electrodes D are connected to different bitlines BL through bitline plugs 180, respectively. As illustrated, the bitlines BL are formed in a direction crossing the gate electrodes 120.

According to embodiments of the present invention, a source plate 160 is disposed between the bitlines 190 and the gate electrode 120. The source plate 160 may be electrically connected to the common source line CSL and include an opening 165 formed in the vicinity of the bitline plugs 180. The opening 165 may have various widths and shapes and be formed to have a possibly decreased area within the range of satisfying the condition to electrically isolate the opening 165 from the bitline plug 180.

In one embodiment, the source plate 160 may be formed by means of the same process as the common source line CSL. In this case, the source plate 160 and the common source line CSL may be formed of the same material. In an alternative embodiment, as illustrated, the source plate 160 may be formed by means of a different process than the common source line CSL, so that they may be formed of different materials.

The source plate 160 may be electrically connected to a source line SL by a source-line plug 185. The source line SL may be formed by means of the same process as the bitlines BL. As illustrated, the source line SL may be disposed between the bitlines.

FIGS. 7 through 10 are cross-sectional views illustrating modified embodiments of the present invention. Except technical characteristics that will be described later, each of the modified embodiments may be identical to the embodiments explained with reference to FIGS. 2 through 5. Thus, duplicate explanations will be omitted to simplify the description.

Figure 7:
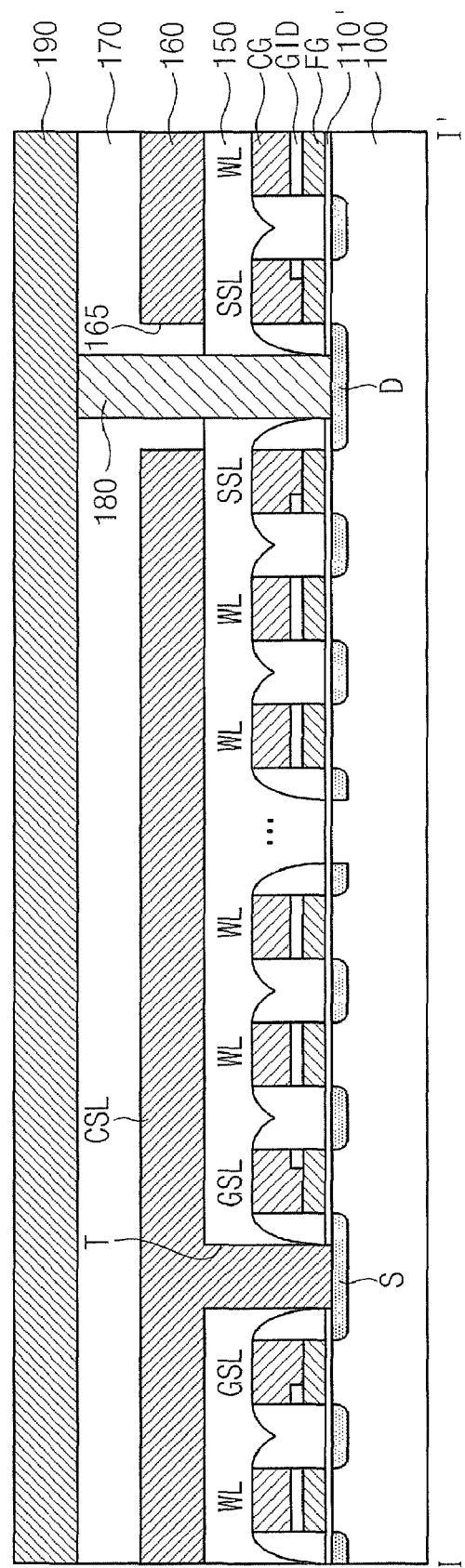
FIGS. 7 through 10 are cross-sectional views showing a portion of a cell array region of a NAND flash memory device according to modified embodiments of the present invention.

Referring to FIG. 7, a memory cell transistor may be a floating gate type transistor using a floating gate electrode as a structure for charge storage. More specifically, the memory cell transistor may include a tunnel insulating layer 110', a floating gate electrode FG, an intergate dielectric GID, and a control gate electrode CG which are stacked in the order named. The floating gate electrode FG is surrounded by the tunnel insulating layer 110', the intergate dielectric GID, and the gate spacer 140, which are each made of an insulative material, to be electrically isolated. In case of this embodiment, as well known, the amount of charges injected into the floating gate electrode FG through the tunnel insulating layer 110' determine information of a corresponding memory cell.

Figure 8:
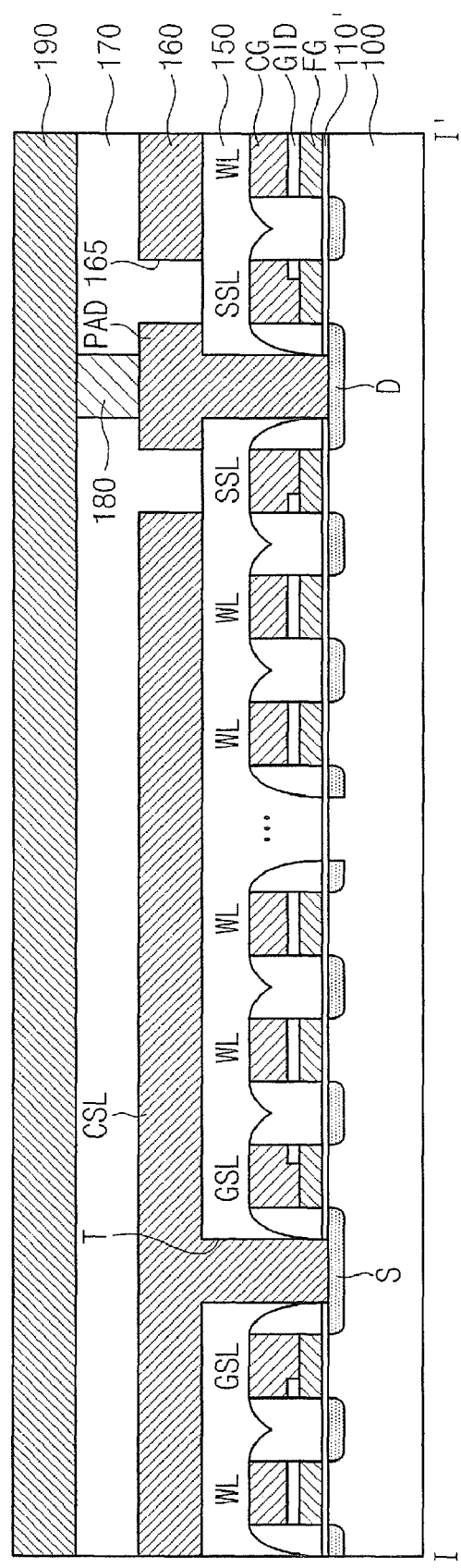

Referring to FIG. 8, the source conductive layer may be used as a pad PAD for connecting the bitline BL to the drain electrode D. More specifically, the first interlayer dielectric 150 may include contact holes formed to expose the drain electrodes D, and the source conductive layer ma be formed to fill the contact holes. The contact holes may use the same process as the trench T, being formed at the same time of forming the trench T. Afterwards, the source conductive layer may be patterned during a process of forming the source plate 160 to form a pad PAD spaced apart from the source plate 160 and connected to the drain electrode D. Height, thickness, and material of the formed pads PAD are substantially identical to those of the source plate 160.

Figure 9:
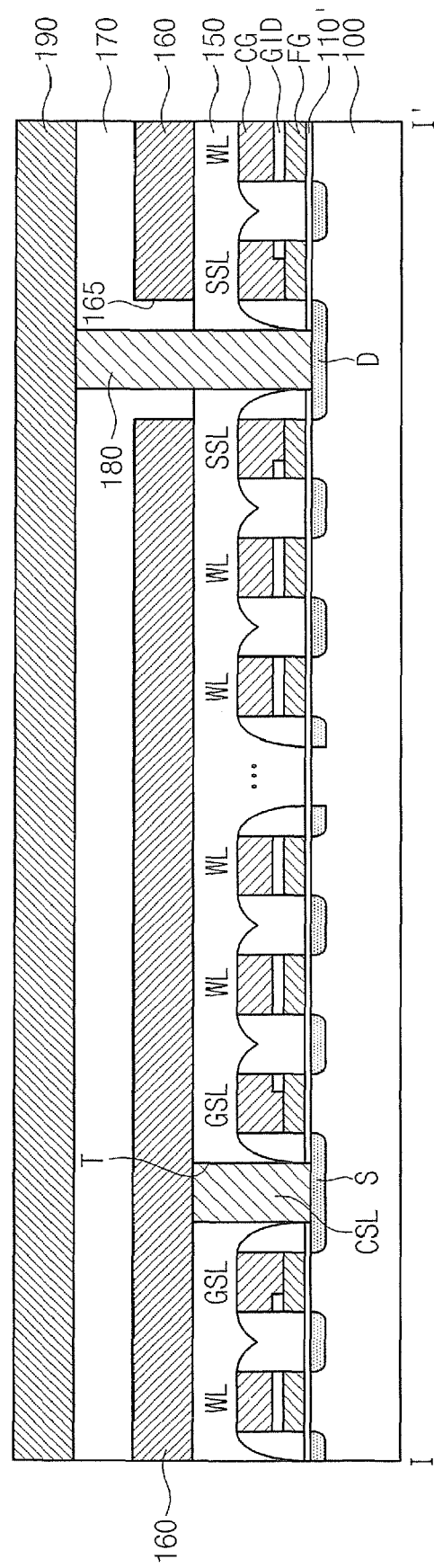

Referring to FIG. 9, the trench T is filled with a common source line CSL which electrically connect the source electrodes S to one another. The source plate 160 is formed on the first interlayer dielectric 150 to be connected to the common source line CSL. The source plate 160 may be formed by means of a different process than the common source line CSL. In this case, the source plate 160 and the common source line CSL may be formed of the same material or different materials.

More specifically, after forming a conductive layer to fill the trench T, the conductive layer is etched down to a top surface of the first interlayer dielectric 150 to form the common source line CSL. After forming a source conductive layer on the first interlayer dielectric 150 to be connected to the common source line, the source conductive layer is patterned to form the source plate 160. The source plate 160 may be formed by means of a well known damascene process.

Figure 10:
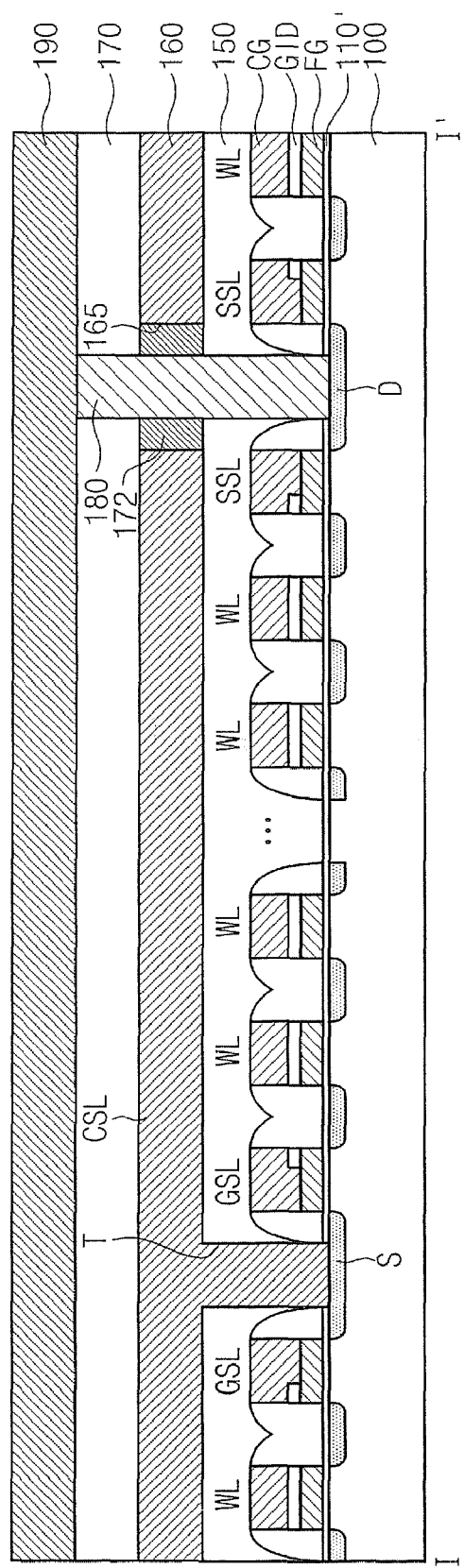

Referring to FIG. 10, a diffusion barrier layer 172 may be disposed between a sidewall of the opening 165 and the bitline plug 180. The diffusion barrier layer 172 may be at least one of insulative materials capable of efficiently blocking diffusion of impurities. The diffusion barrier layer 172 may be, for example, silicon nitride or silicon oxynitride. In this case, the entire surface of the memory cell array is fully veiled with the diffusion barrier layer 172 and the source plate 160, which makes it possible to prevent the mobile charges and damage from affecting memory cell transistors in a subsequent process. The diffusion barrier layer 172 may be identically formed in the embodiments described with reference to FIGS. 7 through 9.

Figure 11:
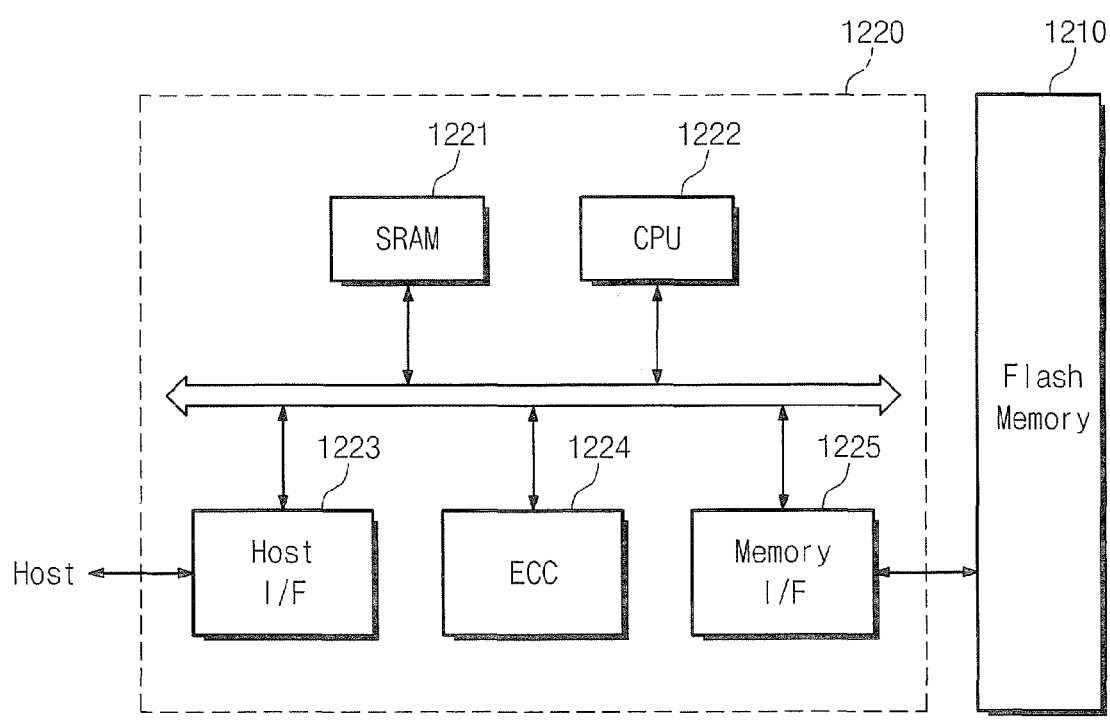
FIG. 11 is a block diagram of a memory card including a flash memory device according the present invention.

FIG. 11 is a block diagram of an example of a memory card including a flash memory device according to the present invention.

Referring to FIG. 11, a memory card 1200 for supporting massive data capacity is equipped with a flash memory device 1210. The memory card 1200 includes a memory controller 1220 configured to control general data exchange between a host and the flash memory device 1210.

An SRAM 1221 is used as an operation memory of a central processing unit (CPU) 1222. A host interface (Host I/F) 1223 includes a data exchange protocol of a host connected to the memory card 1200. An error correction code block (ECC) 1224 detects and corrects errors included in data read out of a multi-bit flash memory device 1210. A memory interface (Memory I/F) 1225 interfaces with the flash memory device 1210 according to the present invention. The CPU 1222 performs general control operations for exchanging data of the memory controller 1220. Although not shown in the figure, it is apparent to those skilled in the art that the memory card 1200 may further include a ROM storing code data for interfacing with the host.

According to the above-described flash memory device, memory card or memory system, a highly reliable memory system may be provided through a flash memory device 1200 having an improved erase characteristic of dummy cells. Especially, a flash memory device according to the present invention may be provided for a memory system such as a solid state disk (SSD) which has been actively studied in recent years. In this case, read error arising from a dummy cell may be blocked to achieve a highly reliable memory system.

Figure 12:
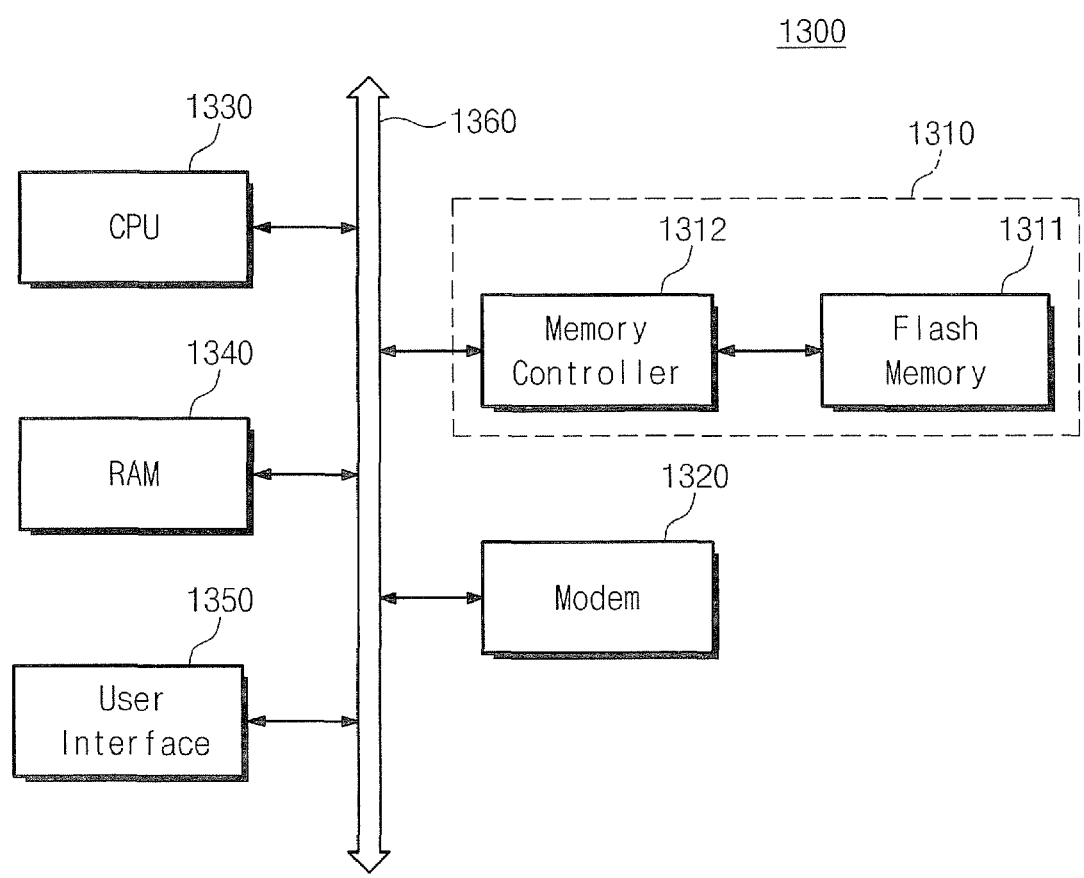
FIG. 12 is a block diagram of an information processing system including a flash memory system according to the present invention.

FIG. 12 is a block diagram of an information processing system 1300 equipped with a flash memory system 1310 according to the present invention. The flash memory system 1310 is installed at an information processing system such as a mobile device or a desktop computer. The information processing system 1300 includes a modem 1320 electrically connected to the flash memory system 1310 and each system bus 1360, a central processing unit (CPU) 1330, a RAM 1340, and a user interface 1350. The flash memory system 1310 has the substantially same configuration as the above-described memory system or flash memory system. Data processed by the CPU 1330 or externally input data is stored in the flash memory system 1310. The flash memory system 1310 may include a solid state disk (SSD). In this case, the information processing system 1300 may store massive data in the flash memory system 1310. With the increase in reliability, the flash memory system 1310 may reduce resources required for error correction to provide a high-speed data exchange function to the information processing system 1300. Although not shown in the figure, it is apparent to those skilled in the art that the information processing system 1300 may further include an application chipset, a camera image processor (CIS), and an input/output device.

A flash memory device or a memory system according to the present invention may be packaged using various types of packages. For example, a flash memory device or memory controller according to the present invention may be packaged using packages such as PoP (Package on Package), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), Wafer-Level Processed Stack Package (WSP), and the like.

As explained so far, a source plate is formed to veil entirely an interlayer dielectric at the memory cell array region except a region where bitline plugs are disposed. Thus, the source plate can prevent mobile charges and damage from affecting memory cell transistors in a subsequent process. The source plate is formed by means of a patterning process. Although a scratch is formed on an interlayer dielectric, a conductive material in the scratch is fully removed by an etching step of the patterning process. Therefore, it is possible to prevent electrical short caused by a bridge.

Although the present invention has been described in connection with the embodiment of the present invention illustrated in the accompanying drawings, it is not limited thereto.

It will be apparent to those skilled in the art that various substitutions, modifications and changes may be made without departing from the scope and spirit of the invention.

What is claimed is:

1. A non-volatile memory device, comprising:
a memory array comprising a plurality of strings of non-volatile memory cells located at side-by-side locations in a substrate, said plurality of strings of non-volatile memory cells comprising a row of ground select transistors;
a plurality of bit lines electrically coupled to respective ones of the plurality of strings of non-volatile memory cells; and
a source plate electrically coupled to source regions of the row of ground select transistors, said source plate extending in two-dimensions over a plurality of word lines associated with each of the plurality of strings of non-volatile memory cells.

2. The non-volatile memory device of claim 1, wherein said source plate extends as an uninterrupted layer across a plurality of rows of the plurality of strings of non-volatile memory cells.

3. The non-volatile memory device of claim 2, wherein said source plate extends between said plurality of bit lines and said plurality of strings of non-volatile memory cells.

4. The non-volatile memory device of claim 3, wherein each of the plurality of strings of non-volatile memory cells comprises a string select transistor having a drain region in the substrate; and wherein each of said plurality of bit lines is electrically coupled to a corresponding drain region of a string select transistor.

5. The non-volatile memory device of claim 1, wherein each of the plurality of strings of non-volatile memory cells comprises a string select transistor having a drain region in the substrate; and wherein each of said plurality of bit lines is electrically coupled to a corresponding drain region of a string select transistor.

6. The non-volatile memory device of claim 4, further comprising a source line electrically coupled by a source line plug to said source plate; and wherein said source line is coplanar with said plurality of bit lines.

7. The non-volatile memory device of claim 1, wherein each of the plurality of strings of non-volatile memory cells comprises a string select transistor having a drain region in the substrate; and wherein each of said plurality of bit lines is electrically coupled by a bit line plug to a corresponding drain region of a string select transistor.

8. The non-volatile memory device of claim 7, further comprising a diffusion barrier layer surrounding each of a plurality of the bit line plugs; and wherein the diffusion barrier layer is coplanar with said source plate.

9. The non-volatile memory device of claim 8, wherein the diffusion barrier layer comprises an electrically insulating material selected from a group consisting of silicon nitride and silicon oxynitride.

10. An integrated circuit memory device, comprising:
a non-volatile memory array comprising a plurality of NAND-type strings of non-volatile memory cells having respective ground select transistors and string select transistors therein;
a source plate extending over the plurality of NAND-type strings of non-volatile memory cells, said source plate electrically coupled to source terminals of each of the ground select transistors; and
a plurality of bit lines extending over said source plate, said plurality of bit lines electrically coupled to drain terminals of each of the string select transistors.

11. The memory device of claim 10, wherein said source plate is configured as a continuous metal layer that operates to electromagnetically shield the non-volatile memory cells from fluctuations in voltages on said plurality of bit lines during memory programming operations.

12. A semiconductor device comprising:
a semiconductor substrate including a cell array region;
memory cell transistors disposed at the cell array region;
bitlines disposed on the memory cell transistors; and
a source plate disposed between the memory cell transistors and the bitlines to veil the memory cell transistors thereunder.

13. The semiconductor device as set forth in claim 12, wherein the cell array region include parallel active regions each including a source region where a source electrode is formed, a drain region where a drain electrode is formed, and a plurality of cell regions between the source region and the drain region; and
wherein the source plate has an opening formed over the drain region and, except the opening, the entire surface of the cell array region is covered with the source plate.

14. The semiconductor device as set forth in claim 13, further comprising:
a bitline plug penetrating the source plate through the opening to connect the bitline with the drain electrode.

15. The semiconductor device as set forth in claim 14, further comprising:
a diffusion barrier layer disposed between the source plate and the bitline plug.

16. The semiconductor device as set forth in claim 13, further comprising:
a common source line disposed below the source plate to electrically connect the source electrodes with one another,
wherein the source plate is electrically connected with the common source line.

17. The semiconductor device as set forth in claim 13, wherein the source plate extends toward the source regions to be used as a common source line connecting electrically the source electrodes with one another.

18. The semiconductor device as set forth in claim 13, further comprising:
pads spaced apart from the source plate and disposed in the opening,
wherein height, thickness, material of the pads are substantially identical to those of the source plate.

19. The semiconductor device as set forth in claim 12, wherein the memory cell transistors are non-volatile memory transistors constituting a NAND memory cell string.

20. The semiconductor device as set forth in claim 19, wherein each of the memory cell transistors is either one of a charge trap type non-volatile memory transistor and a floating gate type memory transistor.

* * * * *